(12) United States Patent
Garcia et al.

(10) Patent No.: US 6,275,593 B1
(45) Date of Patent: Aug. 14, 2001

(54) APPARATUS AND METHODS FOR THE HARMONIC ENHANCEMENT OF ELECTRONIC AUDIO SIGNALS

(75) Inventors: Arturo J. Garcia, Miami; Arturo H. Garcia, Coral Gables, both of FL (US)

(73) Assignee: True Dimensional Sound, Inc., Coral Gables, FL (US)

( * ) Notice: Subject to any disclaimer, the term of this patent is extended or adjusted under 35 U.S.C. 154(b) by 0 days.

(21) Appl. No.: 08/700,728

(22) Filed: Aug. 13, 1996

Related U.S. Application Data
(60) Provisional application No. 60/017,540, filed on May 10, 1996.

(51) Int. Cl.[7] .............................. H03G 5/00; H03G 3/00
(52) U.S. Cl. .............................. 381/98; 381/79; 381/61; 381/106
(58) Field of Search ............................. 381/98, 79, 106, 381/58, 59, 61

(56) References Cited

U.S. PATENT DOCUMENTS

| | | |
|---|---|---|
| 1,855,054 | 4/1932 | Johnson . |
| 3,243,511 | 3/1966 | Erdman et al. . |

(List continued on next page.)

FOREIGN PATENT DOCUMENTS

| | | |
|---|---|---|
| 2137427 | 10/1984 | (GB) . |
| 11-086008 | 10/1989 | (JP) . |
| 23-011006 | 3/1991 | (JP) . |

OTHER PUBLICATIONS

Modern Electronic Circuits Reference Manual, John Markus, 1980 McGraw–Hill, ISBN 0–07–040446–1, pp. 53, 60 and 61;.

300 Schaltungen, Elektor Verlag GmbH, 1979, ISBN 3–921608–09–0, p. 15, circuit 16: "Telefon–Mithörgerät";.

273 Schaltungen, Elektor Verlag GmbH, 1980, ISBN 3–921608–03–1, p. 75, circuit 93: "Mithörverstärker für das Telefon"; and.

273 Schaltungen, Elektor Verlag GmbH, 1980, ISBN 3–921608–03–1; pp. 174, 175, circuit 231: "Entzerrer".

Tremaine, Howard M., D.Sc., FAES, "Audio Cyclopedia", Copyright 1959 and 1969 by Howard W. Sams & Co., Inc., pp. 11–23.

(List continued on next page.)

*Primary Examiner*—Forester W. Isen
*Assistant Examiner*—Brian Pendleton
(74) *Attorney, Agent, or Firm*—King & Schickli PLLC

(57) ABSTRACT

The present invention is a method and apparatus for simply and inexpensively enhancing an electronic audio signal in such a way that the quality of audible sound produced from the audio signal more closely approaches that of the original sound heard live in an acoustically designed environment. The present invention restores the perception of harmonics that are normally missing in an electronic audio signal. The apparatus includes a circuit that causes an input audio signal to be distorted such that an enhanced audio signal is produced that exhibits an improved harmonic quality compared to that of the original input audio signal. This distortion is a non-linear amplification of enhancing harmonics or frequencies in the input audio signal. That is, a band of desirable harmonics or frequencies in the input audio signal are non-uniformly amplified across the band. This band of frequencies from the input audio signal can be a band of high frequencies and/or a band of low frequencies. The present circuit accomplishes this enhancement without having to transmit the electronic audio signal through a magnetic coil audio energy transfer system (i.e., a field inducing coil and an electromagnetic field receptor that are weakly coupled electromagnetically).

40 Claims, 6 Drawing Sheets

U.S. PATENT DOCUMENTS

| | | |
|---|---|---|
| 3,370,125 | 2/1968 | Shaw et al. . |
| 3,499,988 | 3/1970 | Watanabe et al. . |
| 3,659,056 | 4/1972 | Morrison et al. . |
| 3,985,977 | 10/1976 | Beaty et al. . |
| 4,079,295 | 3/1978 | den Hollander . |
| 4,490,844 | 12/1984 | Sohn . |
| 4,621,203 | 11/1986 | Sweeny . |
| 4,692,852 | 9/1987 | Hoover . |
| 4,734,897 | 3/1988 | Schotz . |
| 4,748,669 * | 5/1988 | Klayman .................................. 381/1 |
| 4,845,758 | 7/1989 | Op de Beek et al. . |
| 4,866,774 * | 9/1989 | Klayman .................................. 381/1 |
| 5,161,131 | 11/1992 | Borchart et al. . |
| 5,361,306 | 11/1994 | Garcia . |
| 5,515,446 | 5/1996 | Velmer . |
| 5,537,477 | 7/1996 | Gauthier et al. . |
| 5,892,830 * | 4/1999 | Klayman .................................. 381/1 |

OTHER PUBLICATIONS

*Basic Electronics,* vol. 1, U. S. Navy Training Pubs., 1971 p. 168–170 and p. 258.

*Electronic Fundamentals* (*Alternating Current*), Dept. of the Army, 1951, pp. 32–27.

p. 22 of "The Audio Cyclopedia".

Furui, Sadaoki, "Digital speech processing, synthesis, and recognition." pp. 25–29.

* cited by examiner

APPARATUS AND METHODS FOR THE HARMONIC ENHANCEMENT OF ELECTRONIC AUDIO SIGNALS

This appl. claims the benefit of Provisional No. 60/017,540 filed May 10, 1996.

FIELD OF THE INVENTION

The present invention relates to the enhancement of electronic audio signals to improve the quality of sound produced from those signals, and more particularly to an apparatus and method for harmonically enhancing an electronic audio signal without the use of magnetic coupling to obtain the enhancement.

BACKGROUND OF THE INVENTION

It is usually considered more pleasurable to hear music, singing or other such complex sounds live, rather than hearing the same sound after it has been converted into an electronic audio signal and re-converted back into audible sound.

Many of the sounds we hear, especially musical notes, are often a composite. For example, a musical note having a basic pitch or fundamental frequency, usually contains components of the fundamental frequency called harmonics. These harmonics create the tonal quality or timbre of the sound, such as a musical note, that is often unique to the musical instrument or other sound producing source. In other words, these harmonics enrich the sound we hear. Numerous sound reproduction systems have been developed in an attempt to add harmonic enhancement to audio signals. However, these systems are often very sophisticated and expensive and the sound quality produced with such systems still falls short of the perceived quality of the original sound heard live.

A relatively unsophisticated and inexpensive system has been developed which produces an enhanced electronic audio signal which, when converted into audible sound, exhibits an improved harmonic quality compared to that of the original input audio signal and has been perceived as more closely duplicating the experience of hearing the original live sound in an acoustically designed environment. This system is disclosed in U.S. Pat. No. 5,361,306, which is assigned to the assignee of the present application. The exemplary circuits disclosed in the 5,361,306 patent include an input stage having a field inducing coil and an output stage having an electromagnetic field receptor (e.g., another coil) and an output. The field inducing coil and the electromagnetic field receptor are weekly coupled to form a magnetic coil audio energy transfer system. Input audio signals are transmitted through the inducing coil to set-up an electromagnetic field. The field inducing coil and the electromagnetic field receptor are weakly coupled such that when an input audio signal is transmitted through the field inducing coil, an enhanced audio signal is available at the output.

The present invention is an improvement to the invention disclosed in the U.S. Pat. No. 5,361,306. The present invention has a less complicated structure and is less expensive.

SUMMARY OF THE INVENTION

In accordance with the present invention, a number of methods and apparatus are provided for simply and inexpensively enhancing an electronic audio signal in such a way that the quality of audible sound produced from the audio signal is perceived to more closely approaches that of the original sound heard live in an acoustically designed environment. Sound produced from an audio signal enhanced in accordance with the present invention appears to resist degradation at high volumes and tends to eliminate, or at least significantly reduce, the formation of sweet spots. It is desirable for a circuit according to the present invention to be geared toward restoring the perception of harmonics that are normally lost due to the limitations of audio conversion equipment, the recording process, shortcomings of the recording media and/or the like.

In one aspect of the present invention, an apparatus is provided for enhancing the quality of an input audio signal made up of a plurality of signal components, each signal component having an amplitude and a frequency, and the frequencies of the input audio signal being within a band of frequencies having a low end and a high end. An apparatus, according to the principles of the present invention, includes a circuit that causes an input audio signal to be distorted such that an enhanced audio signal is produced that exhibits an improved harmonic quality compared to that of the original input audio signal. This distortion is a non-linear amplification of signal components enhancing harmonics or frequencies within a band of frequencies. signal components having frequencies within a band of desirable harmonics or frequencies are non-uniformly amplified across the band. This band of frequencies can be a band of high frequencies and/or a band of low frequencies. It is desirable for the signal components to be selected and amplified in such a way that the human ear is able to better perceive or pick up and register the harmonic character of the audio signal. The present circuit accomplishes this enhancement without having to transmit the electronic audio signal through a magnetic coil audio energy transfer system (i.e., a field inducing coil and an electromagnetic field receptor that are weakly coupled electromagnetically).

It is desirable for the present apparatus to include a circuit that is operatively adapted so that when an input audio signal as described above is transmitted therethrough, an enhanced audio signal is produced by amplifying signal components, having frequencies between a reference frequency and the high end, so as to increase in amplitude as per increasing frequencies from the reference frequency toward the high end and/or by amplifying signal components, having frequencies increase in amplitude as per decreasing frequencies from the reference frequency toward the low end, each over at least a portion of the band of frequencies. As used herein, the term reference frequency refers to the frequency or frequency range from which the response of all the other frequencies can be compared. In other words, the reference frequency can be seen as the frequency or frequency range after which the distortion (i.e., the enhancement) of the high frequencies and/or of the low frequencies can begin to be seen. It may be desirable for the circuit to be adapted such that the signal component having the reference frequency of the enhanced audio signal produced by the circuit has an amplitude that is substantially similar to (i.e., equal to or slightly above or below) the amplitude of the original input signal.

The present apparatus may include a circuit that uses a high pass filter-like network to non-linearly amplify a band of high frequencies of the input audio signal. Alternatively or in addition, the present apparatus may include a circuit that uses a low pass filter-like network to non-linearly amplify a band of low frequencies of the input audio signal.

In another aspect of the present invention, a method is provided for enhancing the quality of electronic audio signals. The method comprises the steps of: providing an input audio signal made up of a plurality of signal components, each signal component having an amplitude and a frequency, and the frequencies of the input audio signal being a band of frequencies having a low end and a high end; and distorting the input audio signal into an enhanced audio signal by non-linearly amplifying signal components having frequencies within the band of frequencies without the use of a magnetic coil audio energy transfer system and such that the enhanced audio signal exhibits an improved harmonic quality compared to that of the input audio signal. It is desirable for the audio signal being provided to have a bandwidth of frequencies with high frequencies and low frequencies, and for the step of distorting the signal to include non-linearly amplifying signal components having frequencies within a high frequency portion of the bandwidth, a low frequency portion of the bandwidth or both.

The present method can include the step of processing one or more of the enhanced audio signals into sound. The scope of the present invention is intended to include the sound that is so produced. The present enhanced audio signal and the sound produced therefrom includes audio signals and sounds having frequency bands which overlap or otherwise fall within the range of normal human hearing (i.e., approximately 20 Hz to 20 KHz).

The present method can also include the step of transmitting one or more audio signals enhanced according to the present invention from one location to another. The present method can further include the step of recording one or more of the present enhanced audio signals onto a recording medium. The scope of the present invention is also intended to include the recording medium having one or more of the present enhanced audio signals recorded thereon. The recording medium can be a magnetic recording medium (e.g., reel-to-reel tape, cassette tape, magnetic disk, etc.) or an optical recording medium (e.g, compact disk, video disk, etc.). The present invention is not intended to be limited to any particular type of recording medium or method of recording thereon.

The present invention provides an apparatus and method for enhancing the harmonic quality of an electronic audio signal, in particular an audio signal having a complex wave form (i.e., multiple frequencies) such as, for example, music, singing, speech, animal or nature sounds, equipment noises, and the like. An audio signal enhanced according to the present invention exhibits an improved harmonic quality compared to that of the input electronic audio signal. Such a harmonic enhancement cat be obtained using a circuit like one of those disclosed in U.S. Pat. No. 5,361,306 and U.S. Pat. application Ser. No. 08/472,876, having a filing date of Jun. 7, 1995 and entitled APPARATUS AND METHOD OF ENHANCING ELECTRONIC AUDIO SIGNALS.

The present invention is predicated, at least in part, upon the discovery that the harmonic enhancement obtained using the invention described in the U.S. Pat. No. 5,361,306 and in the U.S. Pat. application Ser. No. 08/472,876 can be obtained without using a magnetic coil audio energy transfer system (i.e., a field inducing coil weakly coupled electromagnetically to an electromagnetic field receptor). The present teachings and disclosure reveal that there are a variety of other ways of obtaining the same or a similar harmonic enhancement in an electronic audio signal. Having been provided with the teachings and the exemplary circuits disclosed herein, it will be a matter of simple trial and error experimentation, if any, for one of ordinary skill in the art to design additional ways to produce the same or a similar enhancing effect. Accordingly, the general and specific circuits disclosed herein are examples only and the present invention is not intended to be so limited.

DETAILED DESCRIPTION OF THE INVENTION

Although the present invention is herein described in terms of specific embodiments, it will be readily apparent to those skilled in this art that various modifications, re-arrangements, and substitutions can be made without departing from the spirit of the invention. The scope of the present invention is thus only limited by the claims appended hereto.

Each of the particular exemplary embodiments disclosed in the present application produce generally the same type of enhancement in an electronic audio signal. An apparatus, according to the principles of the present invention, comprises a circuit 8 capable of distorting an input audio signal transmitted therethrough by non-linearly (i.e., non-uniformly) amplifying enhancing harmonics or frequencies in the input audio signal. The present circuit 8 is operatively adapted to accomplish this enhancement without having to transmit the electronic audio signal through a magnetic coil audio energy transfer system (i.e., a field inducing coil and an electromagnetic field receptor that are weakly coupled electromagnetically), such as that disclosed in U.S. Pat. No. 5,361,306 and U.S. Pat. application Ser. No. 08/472,876, having a filing date of Jun. 7, 1995 and entitled APPARATUS AND METHOD OF ENHANCING ELECTRONIC AUDIO SIGNALS, both of which are incorporated herein by reference in their entirety. By increasing the amplitude of enhancing harmonics in this manner, the resulting enhanced audio signal exhibits an improved harmonic quality compared to that of the input audio signal.

EXEMPLARY EMBODIMENT NO. 1

Figure 1:
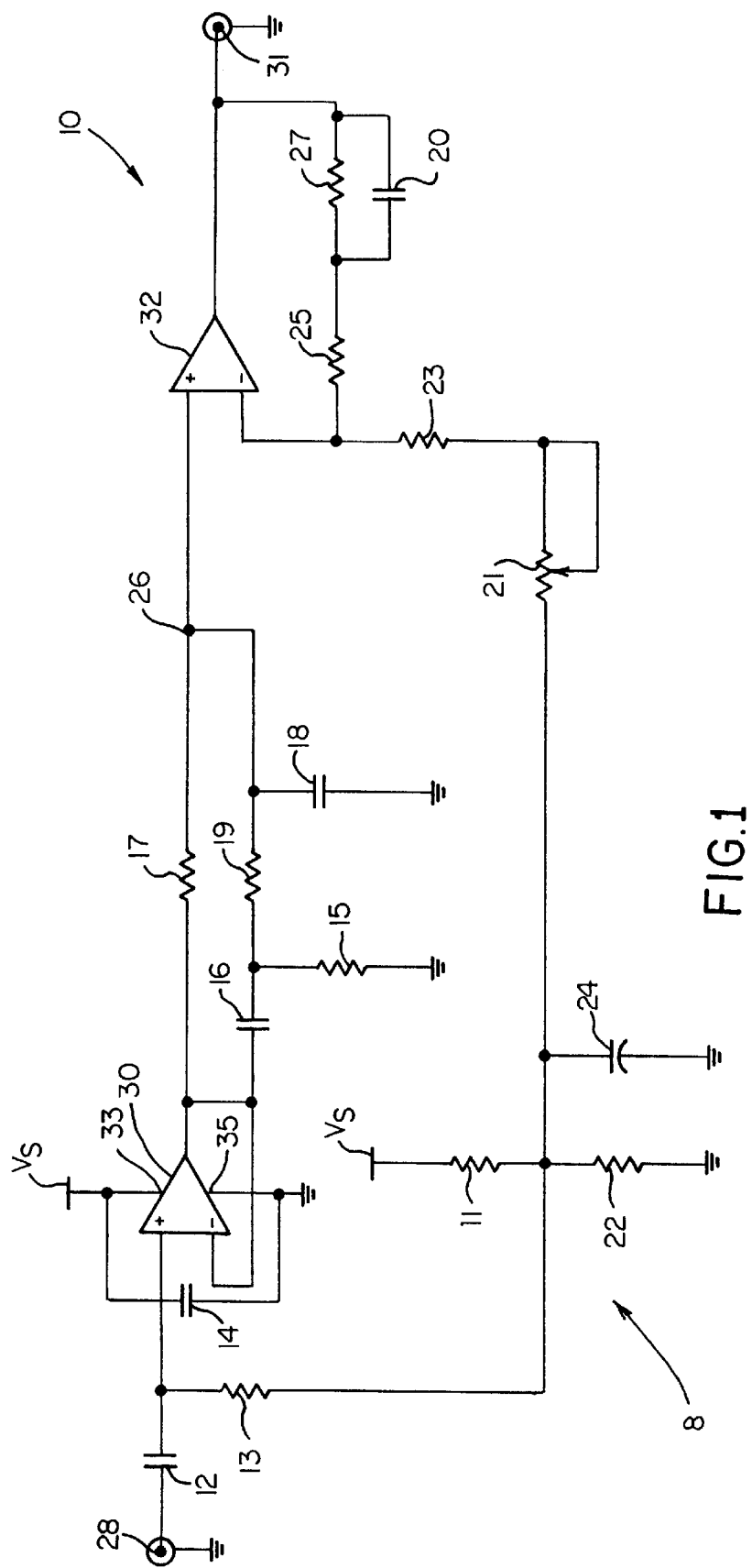
FIG. 1 is a circuit diagram of one embodiment of the present invention.

Referring to FIG. 1, an exemplary embodiment 10 of the present circuit 8 can be separated into an input stage, a primary shaping stage, and an output stage. The input stage includes a coupling capacitor 12 that connects the balance of the circuit 10 to a source of electronic audio signals (not shown) through an input 28. The capacitor 12 provides decoupling to remove any DC component that may be present in an input audio signal received from the signal source. A resistor 13 provides a bias path for the input of an operational amplifier 30. A capacitor 14 is used for power supply filtering. The capacitor 14 is not connected to the input of the amplifier 30. Two resistors 11 and 22 form a divider network to generate a reference voltage at one half of a supply voltage $V_S$. For example, the divider network can divide a supply voltage $V_S$ of 12 volts into a reference voltage of 6 volts. The resistor 13 biases the reference voltage before it reaches the input of the amplifier 30. A capacitor 24 provides AC filtering for the supply voltage. The input amplifier 30 is a buffer amplifier exhibiting a voltage gain of one. The input buffer amplifier 30 isolates the primary shaping stage from the signal source.

The primary shaping stage includes a capacitor 16 and a resistor 15 which, it is believed, form a high frequency enhancement network that causes a non-linear accentuation of a band of high frequencies in the input signal. A resistor 19 and a capacitor 18 are believed to function as a low pass filter which rounds off the high frequency accentuation. In other words, the network comprising the resistor 19 and the capacitor 18 is an attenuating circuit for limiting the highest amplitude of the accentuated high frequencies. The resistor 19 is an attenuating resistor and tends to reduce the output signal by reducing the current that flows through the capacitor 16. A resistor 17 sums the output of the buffer amplifier 30 with the output of the loop containing the capacitor 16. That is, at the node 26 to the right of the resistor 17, the original input signal coming from the amplifier 30 is summed with the high frequency enhanced signal supplied through the loop containing the capacitor 16. The resistor 17 can be used to control the intensity of the high frequency enhancement (i.e., how pronounced it is) in the signal. The high frequency enhancement becomes more pronounced as the resistance of the resistor 17 increases.

The output stage includes an output 31 and an output amplifier 32 which increases the voltage gain and buffers the summed signal from node 26. It is desirable for the gain to be increased so that the final output signal has perceptibly about the same volume level as that exhibited by the original input signal. The amplifiers 30 and 32 can be separate components, but it is desirable for the amplifiers 30 and 32 to be in the form of one dual operational amplifier, as shown. Both amplifiers 30 and 32 are connected to the same supply voltage $V_S$ through the same pin or terminal 33 and both are connected to the same ground through the same pin or terminal 35.

The output stage also includes a low frequency enhancement network which includes a resistor 25 in series with a resistor 27 in parallel with a capacitor 20. This low frequency enhancement network is believed to cause a non-linear accentuation of a band of the low frequencies in the signal. Resistors 25 and 27 and capacitor 20 boost the level (i.e., increase the amplitude) of the low frequencies relative to the high frequencies. In particular, resistors 25 and 27 and capacitor 20 function as a low pass filter-like network that allows low end frequencies of the signal to be selectively reamplified through amplifier 32 to a greater amplification. In other words, the output stage is designed to non-uniformly amplify a low frequency band or spectrum within the overall bandwidth of the signal. Thus, while the primary shaping stage is believed to selectively enhance (i.e., non-uniformly increase the amplitude of) a band of high frequencies in the signal, the output stage is believed to function, in part, as a secondary shaping stage to selectively enhance (i.e., non-uniformly increase the amplitude of) a band of low frequencies in the signal.

It is desirable for the volume of the input signal and the enhanced signal to be perceived as being generally the same. In order to obtain this perceived uniformity in volume, the output stage can be adapted so as to sufficiently amplify the harmonically enhanced signal. The overall gain provided by the output buffer amplifier 32 is determined, and can be controlled, by the values of a variable resistor or potentiometer 21 and a fixed resistor 23, as well as the fixed resistors 25 and 27. The variable resistor 21 and the fixed resistor 23 are used to uniformly adjust the amplitude of all the frequencies in the signal. Pot 21 is connected as a rheostat and together with resistors 23, 25 and 27 determine the DC and low frequency gain of amplifier 32. The adjustability of resistor 21 can be used to compensate for component variations which affect the overall gain of the signal through the circuit 10. In this way, the perceived amplitude of the output signal can be maintained generally the same as that of the input signal. Once a desired resistance for the potentiometer 21 is determined, the pot 21 and the fixed resistor 23 can be replaced with a single fixed value resistor. Thus, it is believed that the output stage uniformly amplifies all the frequencies of the high frequency enhanced signal at the same time it is non-uniformly favoring or amplifying the lower frequencies of the signal.

EXEMPLARY EMBODIMENT NO. 2

Figure 2:
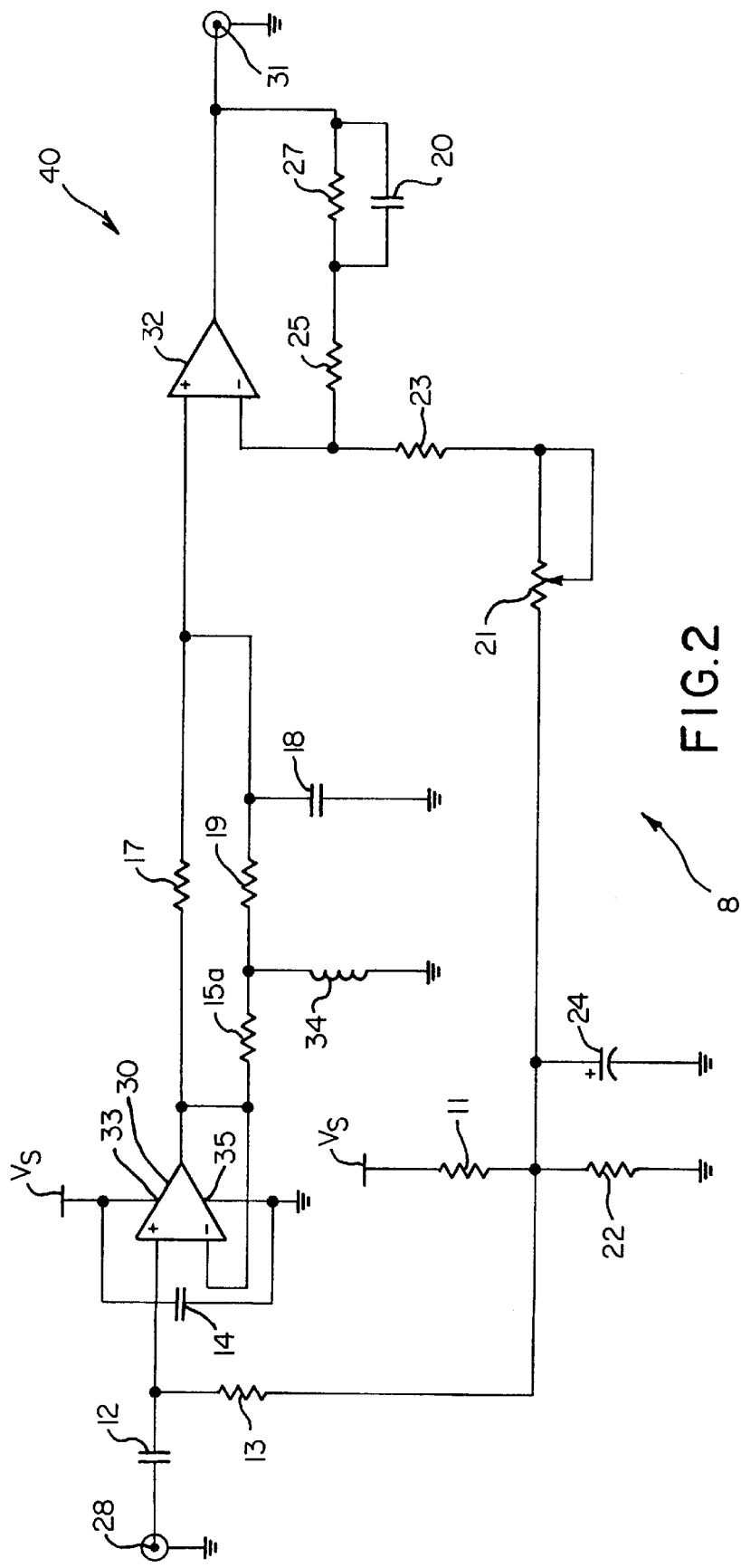
FIG. 2 is a circuit diagram of another embodiment of the present invention.

Referring to FIG. 2, an alternative embodiment 40 of the present circuit 8 includes many components which are substantially identical or at least similar to those found in the circuit 10 of FIG. 1, Therefore, such components are indicated by the same reference numerals and are not explained repeatedly herein. The circuit 40 is a modified version of the circuit 10 in that an RL high pass filter-like network made up of a resistor 15a and an inductor or coil 34 is substituted for the RC high pass filter-like network of the circuit 10 made up of the capacitor 16 and the resistor 15. In the circuit 40, the resistor 15a is located at the former site of the capacitor 16, and the inductor 34 is located at the site previously occupied by the resistor 15. The remaining components forming the circuit 40 are the same type as those used in the circuit 10 and are, therefore, indicated with the same reference numerals.

It is believed that the resistor 15a can have the same or a different value than that of the resistor 15, depending on the value (i.e., the configuration) of the inductor 34 and the enhancement desired. When the resistors 15 and 15a have about the same value, it is believed that the circuits 10 and 40 can be made to produce the same enhanced output signals by modifying the inductor 34 (e.g., changing the number of turns, size wire, etc.). It may be necessary to vary the values of one or more of the various resistors and capacitors in the circuit 40 in order to obtain the same enhanced output signal as that obtained using the circuit 10. The RC network of circuit 10 is believed to be more desirable due to the typically lower cost and size of the capacitor 16 versus the inductor 34.

EXEMPLARY EMBODIMENT NO. 3

Figure 3A:
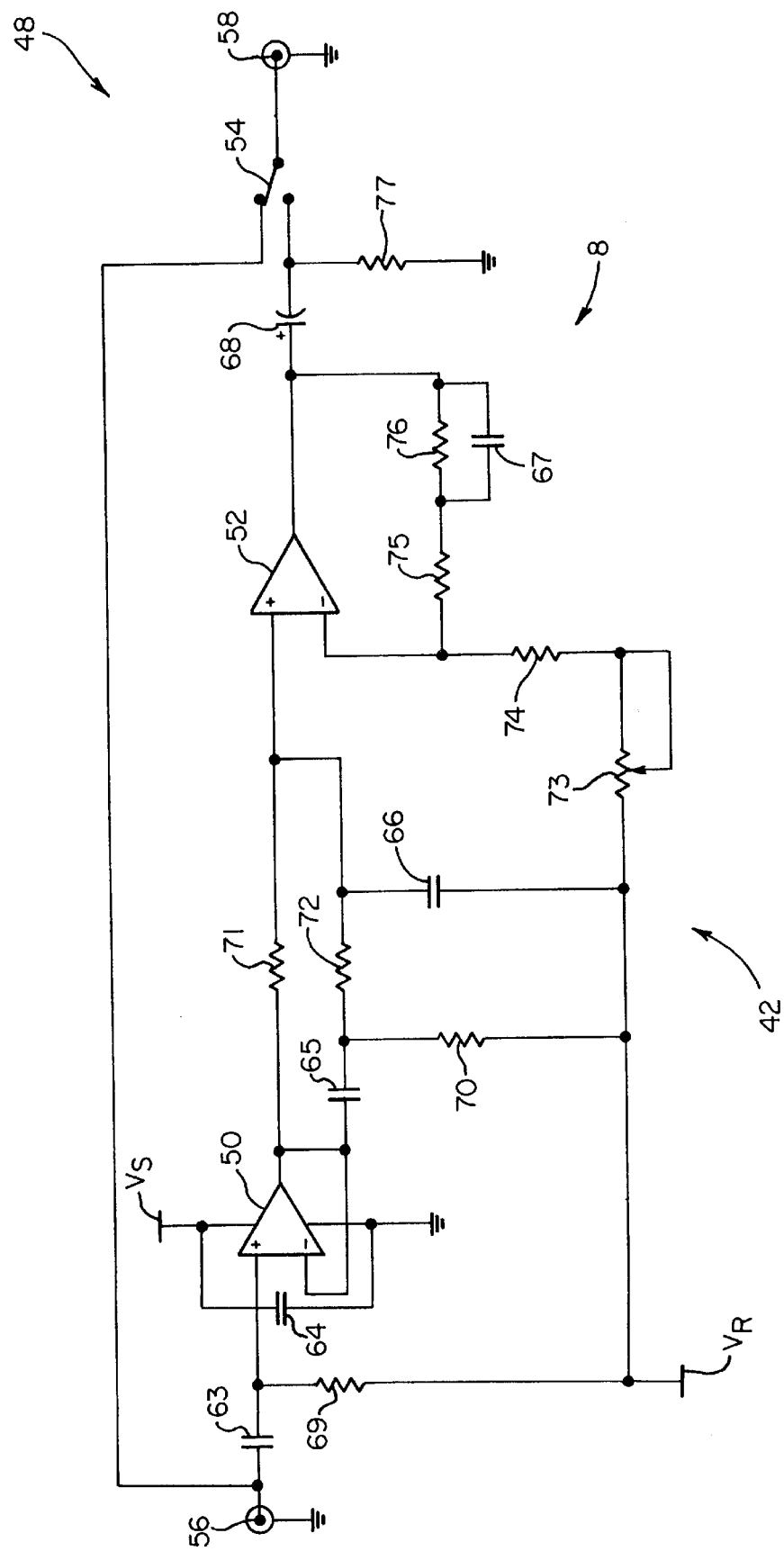
FIGS. 3A, 3B, and 3C are circuit diagrams of the left channel circuit, right channel circuit and power supply circuit of a stereo embodiment of the present invention respectively.
Figure 3B:
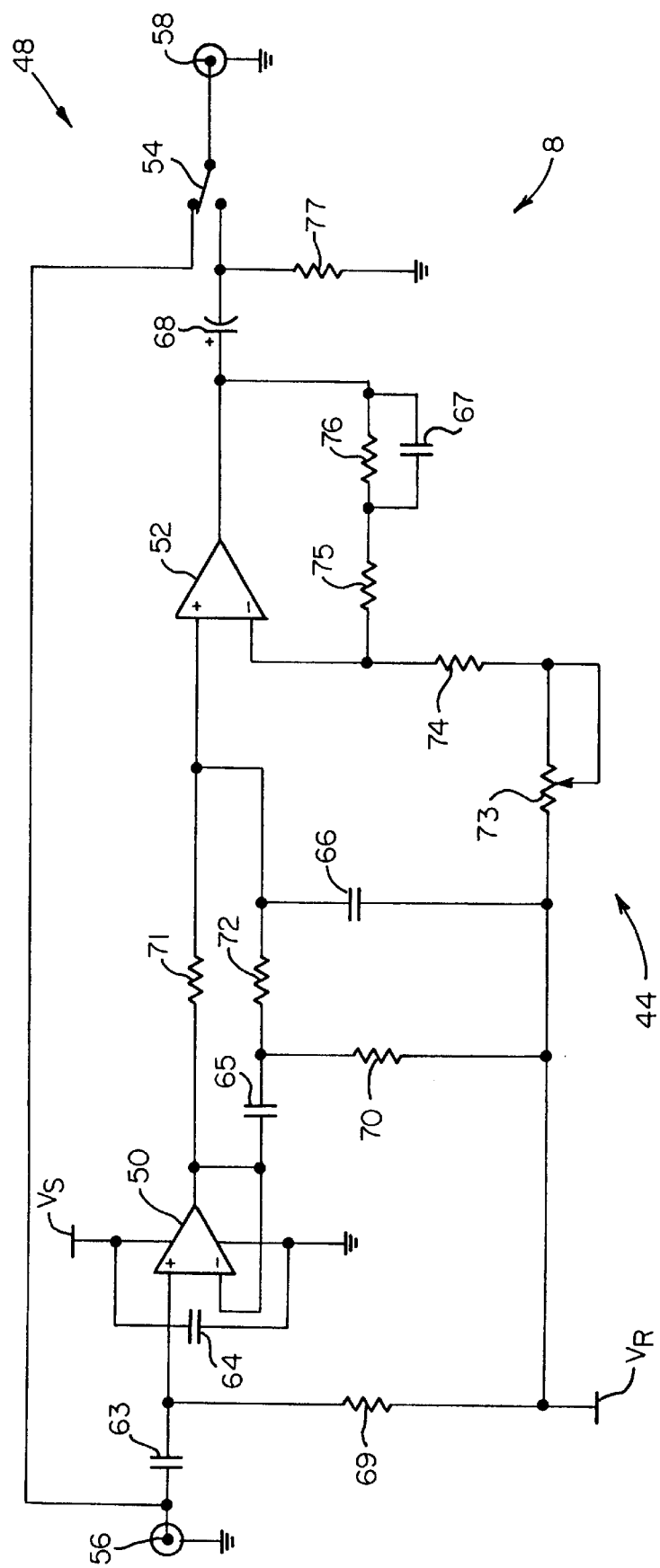
Figure 3C:
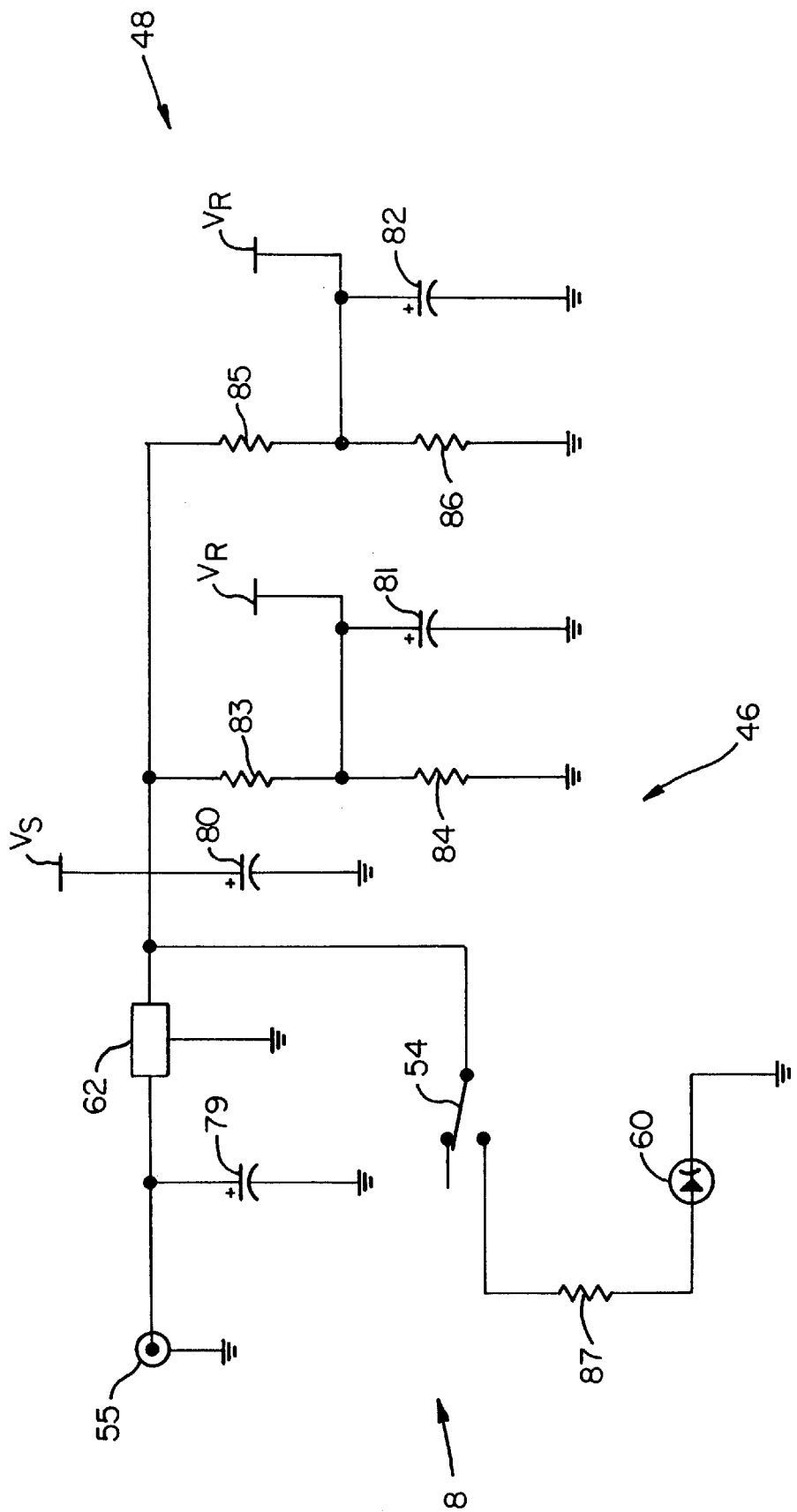

Referring to FIGS. 3A, 3B, and 3C, respectively, a further embodiment 48 of the present circuit 8 includes a left channel circuit 42, a right channel circuit 44 and a power supply circuit 46. Satisfactory results have been obtained when this dual-channel circuit 48 is made using the particular components and values listed in the Table below, according to their corresponding reference numerals. The circuit 48 of FIGS. 3A–C is basically a dual channel version of the circuit 10 of FIG. 1. Therefore, in analyzing circuit 48, reference should be made to the above discussion regarding FIG. 1. Differences between the channel circuits 42 and 44 and the circuit 10 of FIG. 1 are described below.

The supply voltage $V_S$ of the circuit 10 of FIG. 1 is halved by the divider network of resistors 11 and 22, and the circuit 10 is connected to ground through the resistor 15 and the capacitor 18. With the circuit 48, in contrast, each of the channel circuits 42 and 44 is not connected to D.C. ground through its corresponding resistor 70 and capacitor 66. In addition, the power supply circuit 46 (see FIG. 3C) supplies the amplifiers 50 and 52 of each channel circuit 42 and 44 with a reference voltage $V_R$ of +6 volts and a supply voltage $V_S$ of +12 VDC. This 12 volt supply voltage $V_S$ is regulated by the voltage regulator 62 from a power supply of 14 to 24 volts connected to input 55. The power supply circuit 46 has left channel network, comprising the resistors 83 and 84 and capacitor 81, and a right channel network, comprising the resistors 85 and 86 and capacitor 82, which provide the reference voltage $V_R$ to the left channel circuit 42 and the right channel circuit 44, respectively. These left and right channel reference voltage networks are identical. The power supply circuit 46 also includes an LED light which turns on and off with the actuation of the switch 54, to indicate whether or not the input signal is being transmitted through the channel circuits 42 and 44.

As with the coupling capacitor 12 of the circuit 10, a coupling capacitor 63 connects the balance of each channel circuit 42 and 44 to a source of electronic audio signals (not shown) and provides decoupling to remove any DC component that may be present in an input audio signal received from the signal source. Unlike the circuit 10, each channel circuit 42 and 44 also includes a coupling capacitor 68 and resistor 77 connected in line before a triple pole, double throw Bypass/Effect switch 54. The capacitor 68 removes the DC component present at the output of the amplifier 52 and the resistor 77 provides a discharge path for any D.C. component coming from the output 58. In this way, the capacitor 68 and the resistor 77 can eliminate an undesirable clicking noise that may be heard each time the corresponding switch 54 is actuated. Each pair of the amplifiers 50 and 52, used in the particular circuit 48 disclosed in the Table, is in the form of a single dual operational amplifier exhibiting linear dynamic characteristics.

As similarly discussed above with regard to the circuit 10, the variable 1 Kohm resistor 73 and the fixed 1%, 1.80 Kohm resistor 74 of the circuit 48 can be replaced with a 1%, 2.74 Kohm resistor. Furthermore, for automobile applications, it may be desirable for the voltage regulator 62 to be eliminated and the power input 55 connected directly to a 12 volt battery of the automobile.

TABLE

Components for the Circuit of FIGS. 3A–C

| Component | Description | Value/ Part No. |
|---|---|---|
| 50/52 | Motorola Dual Op Amp | LM 1458 N |
| 54 | 3PDT Bypass/Effect Switch | — |
| 55 | Power Supply Input | — |
| 56 | RCA Phono Input Jack | — |
| 58 | RCA Phono Output Jack | — |
| 60 | On/Off LED Light | — |
| 62 | National Semiconductor Voltage Regulator | LM 7812 or LM 340T-12 |
| 63 | 5% MYLAR, CAPN | .47 uF, 50 V |
| 64 | 5% MYLAR, CAPN | .01 uF, 50 V |
| 65 | 5% MYLAR, CAPN | .047 uF, 50 V |
| 66 | 5% MYLAR, CAPN | .033 uF, 50 V |
| 67 | 5% MYLAR, CAPN | .015 uF, 50 V |
| 68 | POLCAP, Radial Alum. | 1 uF, 50 V |
| 69 | 1% Resistor | 100 KOHM |
| 70 | 1% Resistor | 249 OHM |
| 71 | 1% Resistor | 20 KOHM |
| 72 | 1% Resistor | 1.1 KOHM |
| 73 | Variable Resistor | 1 KOHM |
| 74 | 1% Resistor | 1.8 KOHM |
| 75 | 1% Resistor | 24.9 KOHM |

TABLE-continued

Components for the Circuit of FIGS. 3A–C

| Component | Description | Value/ Part No. |
|---|---|---|
| 76 | 1% Resistor | 49.9 KOHM |
| 77 | 1% Resistor | 100 KOHM |
| 79, 81, 82 | POLCAP, Radial Alum. | 100 uF, 50 V |
| 80 | POLCAP, Radial Alum. | 1 uF, 50 V |
| 83–86 | 1% Resistor | 1 KOHM |
| 87 | 1% Resistor | 2 KOHM |

Figure 4:
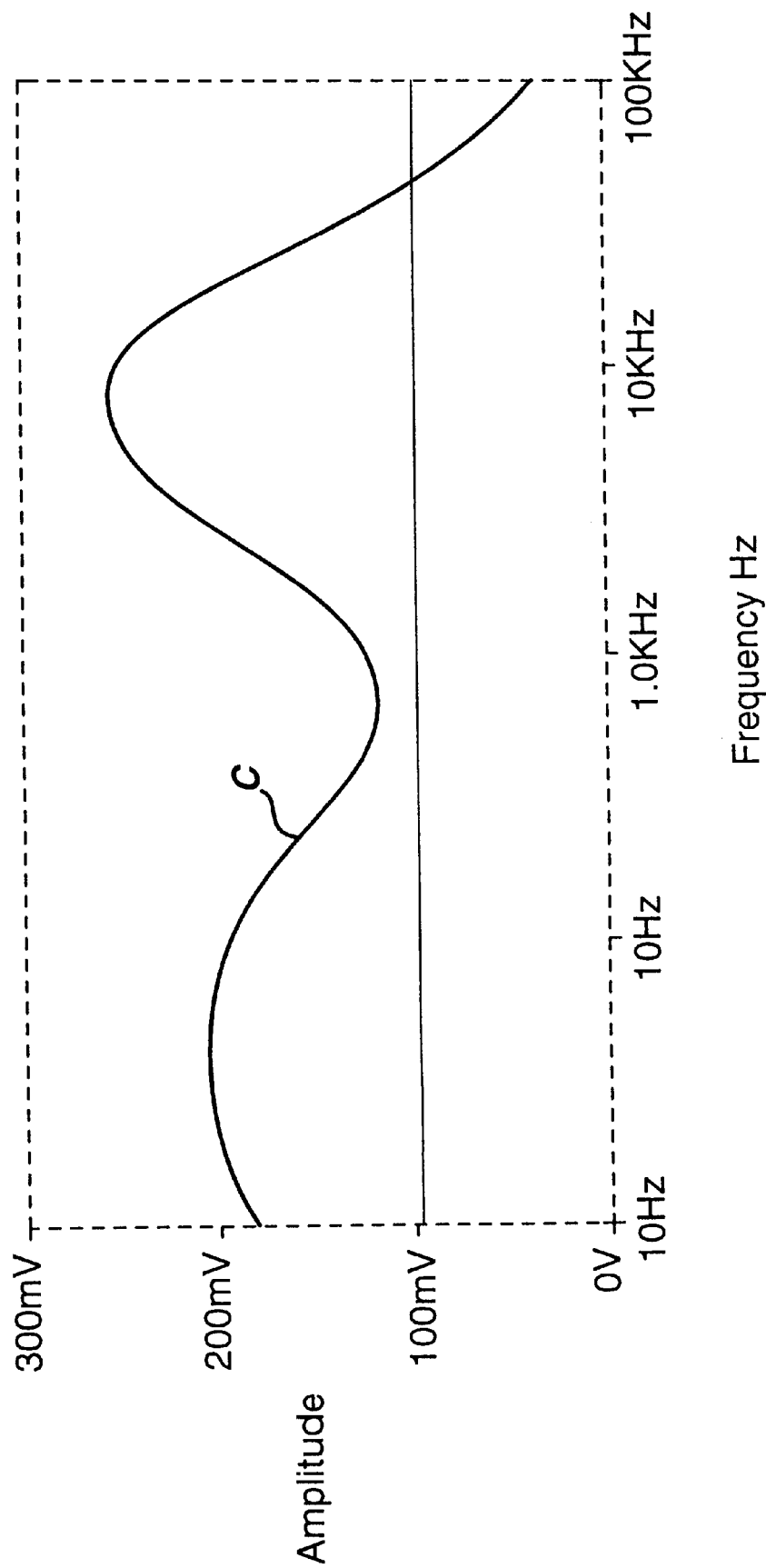
FIG. 4 is a graphical representation of the frequency response curve for the circuit of FIG. 3A and 3B, according to the principles of the present invention.

An electronic audio signal can have a bandwidth of frequencies, with a low end and a high end. It has been found that when an electronic audio signal in the form of a standard symmetrical square wave, comprising a plurality of frequencies with a high end and a low end, is transmitted through the exemplary embodiments of FIGS. 1 and 3A–C, the resulting output audio signal is non-linear. This is evident from FIG. 4, which illustrates an exemplary frequency response curve C generated by each of channel circuit 42 and channel circuit 44. The frequency response curve was obtained by connecting input jack 56 to a signal source S, a conventional signal generator, which generated a sine wave input signal which was swept through a band of frequencies from about 20 Hz to about 22 KHz and connecting the output jack 58 to a resistive load of 50 KOhms, which load represented an equivalent impedance that either channel circuit 42 or channel circuit 44 might see when connected to the input of a conventional audio amplifier. From that curve, it is clear that the resulting output signal includes frequency components which increase in amplitude as per increasing frequencies from a desired reference frequency toward the high end of the signal to form a high frequency peak. This resulting output signal also includes frequency components which increase in amplitude as per decreasing frequencies from the reference frequency toward its low end to form a low frequency peak. The amplitude of the frequency components can begin to decay after the high frequency peak and/or after the low frequency peak, depending on the width of the frequency band of the input signal. There are up to only two amplitude peaks, between the low end and the high end of the input signal bandwidth, see the frequency response curve shown in FIG. 4. The increasing amplitude as per increasing frequencies and increasing amplitude as per decreasing frequencies each occur over at least a portion or band of the overall frequency bandwidth of the signal. The low end of the bandwidth can be at one end of the range of normal human hearing and the high end can be at the other end of the range of normal human hearing. It is believed that the exemplary embodiment of FIG. 2 can produce the same type of enhancing effect as that produced by the exemplary embodiment of FIG. 1.

With regard to the output signal produced when the standard symmetrical square wave is transmitted through the exemplary embodiment of FIG. 1 or of FIGS. 3A–C, respectively, it has been found that changing the value of the resistor 15 or 70 can shift the high frequency peak from one frequency to another; changing the value of the capacitor 16 or 65 can change the sharpness (i.e., the slope) of the increase in amplitude of the frequencies toward the high end; changing the value of the resistor 19 or 72 can change the height (i.e., amplitude) of the high frequency peak; and changing the value of the capacitor 18 or 66 can change the downward slope of decay, toward the high end, after the high frequency peak. In addition, it has been found that changing the value of the resistor 27 or 76 can change the height of the low frequency peak; changing the value of the capacitor 20 or 67 can change the slope of the increase in amplitude of the frequencies, toward the low frequency peak; and changing the value of the resistor 25 or 75 can shift the low frequency peak from one frequency to another.

As used herein, the term reference frequency refers to the frequency or frequency range after which the non-linear amplification (i.e., the enhancement) of the high frequencies and/or of the low frequencies can begin to be seen. The reference frequency can be changed by changing one or more of the components or the component parameters of the particular circuit 8. For example, with regard to the circuit 10 of FIG. 1, the reference frequency can be changed by varying the values of one or more of the components 15, 16, 18–20, 25 and 27. Changing the reference frequency may affect the perceived desirability of the resulting enhancement. For the particular circuit 48 disclosed in detail in FIGS. 3A–C and the Table, the selected reference frequency is a range from about 400 Hz to about 1 KHz. The amplitude of this reference frequency is substantially similar to that of the fundamental frequency of the square wave input signal (i.e., about 1 volt). It is believed desirable for the circuit 48 to have a reference frequency that is closer to about 1 KHz. It may even be more desirable for the reference frequency to be up to about 3.5 KHz (e.g., a range of about 3.2 to about 3.8 KHz).

It is understood that it may also be desirable for a circuit according to the principles of the present invention to produce an output signal, from a square wave input audio signal, that is non-linear with frequencies which either: (1) increase in amplitude as per increasing frequencies from a desired reference frequency toward the high end of the signal, or (2) increase in amplitude as per decreasing frequencies from the reference frequency toward its low end; as well as one which does both. In other words, it may be desirable for the present invention to be used to enhance only a band of high frequencies of an audio signal or only a band of low frequencies of an audio signal, rather than to enhance both a band of the highs and a band of the lows of the signal.

An enhanced audio signal, according to the present invention, exhibits an improved harmonic quality compared to that of the original input audio signal. Additional advantages and modifications will readily appear to those skilled in the art. For instance, it may be desirable for two or more of the above described circuits to be used in series. In addition, using well known techniques and the teachings of the present invention, it is understood that a circuit according to the present invention can be reproduced into an integrated circuit (I.C.) in the form of a hybrid I.C., a monolithic chip, etc. Such an I.C. would be particularly useful in applications where size is important such as, for example, in hearing aids, cellular and other portable telephones, etc. In light of the present teachings, it is also understood that the operation of a circuit according to the present invention (i.e., the present enhancing effect) can be readily reproduced using well known digital signal processing techniques.

Furthermore, when electronic audio signals from a compact disc of music and vocals was transmitted through a circuit of the present invention and the resulting enhanced electronic audio signal re-recorded onto a cassette tape using a consumer cassette player/recorder, the sound quality of the music and vocals produced from the recorded cassette tape was perceptibly better than the same music and vocals produced directly from the compact disc. This occurred even though the compact disc format is widely recognized as producing superior sound quality compared to the cassette tape format.

It is believed that the present invention can be used to enhance electronic audio signals from sound converting equipment, for example a hearing aid, a microphone or the like, before being either recorded onto a recording medium (for example, magnetic tape or optical disk) or converted directly into acoustic sound or other sound impulses. It is also believed that an audio signal enhanced according to the present invention can be transmitted through the air or some other medium, for example, for television, radio, sonar, computer or cellular telephone use; can be transmitted through transmission lines, for example, for telephone, cable TV or computer use; can be converted directly into audible sound, for example, for use at a concert, a play, in a restaurant, or a bar; and that it can be used in any other application which includes an audio signal such as, for example, in distinguishing sonar images, etc.

The present invention in its broader aspects is therefore not limited to the specific details, representative apparatus and method, and illustrative examples shown and described herein. Departures may be made from such details without departing from the spirit or scope of the general inventive concept of the present invention. Therefore, the scope of the invention should be limited only by the following claims and equivalents thereof.

What is claimed is:

1. An apparatus for enhancing the quality of an input audio signal made up of a plurality of signal components, each signal component having an amplitude and a frequency, and the frequencies of the input signal being within a band of frequencies having a low end and a high end, the low end being at one end of the range of normal human being hearing and the high end being at the other end of the range of normal human hearing, said apparatus comprising:

a circuit operatively adapted for distorting the input audio signal, when transmitted therethrough, into an enhanced audio signal such that signal components having frequencies between a reference frequency and the high end increase in amplitude as per increasing frequencies from the reference frequency toward the high end, over at least a portion of the band of frequencies, without using a magnetic coil audio energy transfer system, wherein the enhanced audio signal is recognizable as being the input audio signal enhanced such that audible sound reproduced from the enhanced audio signal exhibits a perceptively improved harmonic quality and sound source separation compared to audible sound reproduced from the undistorted input audio signal; and wherein said circuit further distorts the input audio signal, when transmitted therethrough, such that the signal components having frequencies between the reference frequency and the high end increase in amplitude up to an amplitude peak and there is up to a total of only two amplitude peaks between the low end and the high end.

2. The apparatus as recited in claim 1, wherein said circuit is further operatively adapted so that when the input audio signal is transmitted therethrough, additional signal components having frequencies between the reference frequency and the low end are distorted so as to increase in amplitude as per decreasing frequencies from reference frequency toward the low end, over at least a portion of the band of frequencies.

3. The apparatus as recited in claim 2, wherein said circuit further distorts the input audio signal, when transmitted therethrough, such that the additional signal components increase in amplitude up to an amplitude peak at a peak low frequency and decrease in amplitude as per decreasing frequencies toward the low end below the peak low frequency.

4. The apparatus as recited in claim 1, wherein said circuit is connected to a source of input audio signals.

5. The apparatus as recited in claim 1, wherein said circuit is connected to at least one from the group consisting of a hearing aid, recording medium player, telephone, microphone, television, radio, sonar and computer.

6. The apparatus as recited in claim 1, wherein said circuit is in the form of an integrated circuit.

7. The apparatus as recited in claim 1, wherein said circuit further distorts the input audio signal, when transmitted therethrough, such that the signal components having frequencies between the reference frequency and the high end increase in amplitude up to an amplitude peak at a peak high frequency and decrease in amplitude as per increasing frequencies toward the high end above the peak high frequency.

8. The apparatus as recited in claim 1, wherein the input audio signal is generated by one of a microphone, a recording medium player, a radio, a television, sonar, a computer, a hearing aid and a telephone.

9. The apparatus as recited in claim 1, wherein there is only one amplitude peak between the reference frequency and the high end.

10. The apparatus as recited in claim 1, further comprising a source of the input audio signal, wherein said input audio signal comprises an audio signal of at least one of music, vocals, singing, speech, animal sounds, nature sounds, equipment sounds and other such sounds.

11. The apparatus as recited in claim 1, wherein the input audio signal is a converted form of an original sound, and said apparatus is operatively adapted to distort the input audio signal such that audible sound reproduced from the enhanced audio signal sounds perceptively closer to the original sound heard live in an acoustically designed environment than audible sound reproduced from the input audio signal heard in the same acoustically designed environment.

12. The apparatus as recited in claim 1, wherein said apparatus is operatively adapted such that when the input audio signal is of music provided from a compact optical disc and the enhanced audio signal is recorded onto a cassette magnetic tape, said apparatus imparts an enhancement to the input audio signal such that audible music reproduced from the enhanced audio signal on the cassette tape is clearer and exhibits an improved sound source separation compared to audible music reproduced from the input audio signal on the compact optical disc.

13. An apparatus for enhancing the quality of an input audio signal made up of a plurality of signal components, each signal component having an amplitude and a frequency, and the frequencies of the input audio signal being within a band of frequencies having a low end and a high end, the low end being at one end of the range of normal human hearing and the high end being at the other end of the range of normal human hearing, said apparatus comprising:

a circuit operatively adapted for distorting the input audio signal, when transmitted therethrough, into an enhanced audio signal such that signal components having frequencies between a reference frequency toward the low end, over at as per decreasing frequencies from the reference frequency toward the low end, over at least a portion of the band of frequencies, without using a magnetic coil audio energy transfer system, wherein the enhanced audio signal is recognizable as being the input audio signal enhanced such that audible sound reproduced from the enhanced audio signal exhibits a perceptively improved harmonic quality and sound source separation compared to audible sound reproduced from the undistorted input audio signal; and wherein said circuit further distorts the input audio signal, when transmitted therethrough, such that the signal components having frequencies between the reference frequency and the low end increase in amplitude up to an amplitude peak and there is up to a total of only two amplitude peaks between the low end and the high end.

14. The apparatus as recited in claim 13, wherein there is only one amplitude peak between the reference frequency and the low end.

15. The apparatus as recited in claim 13, further comprising a source of the input audio signal, wherein said input audio signal comprises an audio signal of at least one of music, vocals, singing, speech, animal sounds, nature sounds, equipment sounds and other such sounds.

16. The apparatus as recited in claim 13, wherein the input audio signal is a converted form of an original sound and said apparatus is operatively adapted to distort the input audio signal such that audible sound reproduced from the enhanced audio signal sounds perceptively closer to the original sound heard live in an acoustically designed environment than audible sound reproduced from the input audio signal heard in the same acoustically designed environment.

17. The apparatus as recited in claim 13 wherein said apparatus is operatively adapted such that when the input audio signal is of music provided from a compact optical disc and the enhanced audio signal is recorded onto a cassette magnetic tape, said apparatus imparts an enhancement to the input audio signal such that audible music reproduced from the enhanced audio signal on the cassette tape is clearer and exhibits an improved sound source separation compared to audible music reproduced from the input audio signal on the compact optical disc.

18. A method of enhancing the quality of an electronic audio signal, comprising:

providing an input audio signal made up of a plurality of signal components, each signal component having an amplitude and a frequency, and the frequencies of the input audio signal being within a band of frequencies having a low end and a high end, the low end being at one end of the range of normal human hearing and the high end being at the other end of the range of normal human hearing; and distorting the input audio signal into an enhanced audio signal such that signal components having frequencies between a reference frequency and the high end increase in amplitude as per increasing frequencies from the reference frequency toward the high end, over at least a portion of the band of frequencies, without using a magnetic coil audio energy transfer system and such that the enhanced audio signal is recognizable as being the input audio signal enhanced such that audible sound reproduced from the enhanced audio signal exhibits a perceptively improved harmonic quality and sound source separation compared to audible sound reproduced from the undistorted input audio signal; and wherein said step of distorting includes further distorting the input audio signal such that the signal components having frequencies between the reference frequency and the high end increase in amplitude up to an amplitude peak and there is up to a total of only two amplitude peaks between the low end and the high end.

19. The method as recited in claim 18, wherein said step of distorting also includes distorting additional signal components having frequencies between the reference frequency and the low end so as to increase in amplitude as per decreasing frequencies from the reference frequency toward the low end, over at least a portion of the band of frequencies.

20. The method as recited in claim 19, wherein said step of distorting also includes further distorting the input audio signal such that the additional signal components increase in amplitude up to an amplitude peak at a peak low frequency and decrease in amplitude as per decreasing frequencies toward the low end below the peak low frequency.

21. The method as recited in claim 18 further comprising the step of:

processing the enhanced audio signal into sound.

22. Sound produced according to the method recited in claim 21.

23. The method as recited in claim 18 further comprising the step of:

recording the enhanced audio signal onto a recording medium.

24. A recording medium having at least one enhanced audio signal recorded thereon by the method of claim 23.

25. The recording medium as recited in claim 24, wherein said recording medium is at least one of a magnetic recording medium and an optical recording medium.

26. An electronic audio signal enhanced according to the method of claim 18.

27. The electronic audio signal as recited in claim 26, wherein said electronic audio signal has a bandwidth within the range of human hearing.

28. The method as recited in claim 18 further comprising the step of:

transmitting the enhanced audio signal from one location to another.

29. The method as recited in claim 18 further comprising:

transmitting at least one of the input audio signal and the enhanced audio signal in at least one from the group consisting of an integrated circuit, hearing aid, telephone, microphone, recording medium player, television, radio, sonar and computer.

30. The method as recited in claim 18, wherein there is only one amplitude peak between the reference frequency and the high end.

31. The method as recited in claim 18, wherein the input audio signal comprises an audio signal of at least one of music, vocals, singing, speech, animal sounds, nature sounds, equipment sounds and other such sounds.

32. The method as recited in claim 18, wherein said step of distorting is effected by digital processing.

33. The method as recited in claim 18 further comprising the step of:

transmitting the enhanced audio signal in a source of audio signals.

34. The method as recited in claim 18, wherein the input audio signal is a converted form of an original sound and said distorting step distorts the input audio signal such that audible sound reproduced from the enhanced audio signal sounds perceptively closer to the original sound heard live in an acoustically designed environment than audible sound reproduced from the input audio signal heard in the same acoustically designed environment.

35. The method as recited in claim 18, wherein said step of distorting includes further distorting the input audio signal such that the signal components having frequencies between the reference frequency and the high end increase in amplitude up to an amplitude peak at a peak high frequency and decrease in amplitude as per increasing frequencies toward the high end above the peak high frequency.

36. A method of enhancing the quality of an electronic audio signal, comprising the steps of:

providing an input audio signal made up of a plurality of signal components, each signal component having an amplitude and a frequency, and the frequencies of the input audio signal being within a band of frequencies having a low end and a high end, the low end being at one end of the range of normal human hearing and the high end being at the other end of the range of normal human hearing; and distorting the input audio signal into an enhanced audio signal such that signal components having frequencies between a reference frequency and the low end increase in amplitude as per decreasing frequencies from the reference frequency toward the low end, over at least a portion of the band of frequencies, with out using a magnetic coil audio energy transfer system and such that the enhanced audio signal is recognizable as being the input audio signal enhanced such that audible sound reproduced from the enhanced audio signal exhibits a perceptively improved harmonic quality and sound source separation compared to audible sound reproduced from the undistorted input audio signal; and wherein said step of distorting includes further distorting the input signal such that the signal components having frequencies between the reference frequency and the low end increase in amplitude up to an amplitude peak and there is up to a total of only two amplitude peaks between the low end and the high end.

37. The method as recited in claim 36, wherein there is only one amplitude peak between the reference frequency and the low end.

38. The method as recited in claim 36, wherein the input audio signal comprises at least one of an audio signal of music, vocals, singing, speech, animal sounds, nature sounds, equipment sounds and other such sounds.

39. The method as recited in claim 36, wherein said step of distorting is effected by digital processing.

40. The method as recited in claim 36, wherein the input audio signal is a converted form of an original sound and said distorting step distorts the input audio signal such that audible sound reproduced from the enhanced audio signal sounds perceptively closer to the original sound heard live in an acoustically designed environment than audible sound reproduced from the input audio signal heard in the same acoustically designed environment.

* * * * *

UNITED STATES PATENT AND TRADEMARK OFFICE
CERTIFICATE OF CORRECTION

PATENT NO. : 6,275,593 B1
DATED : August 14, 2001
INVENTOR(S) : Arturo J. Garcia and Arturo H. Garcia It is certified that error appears in the above-identified patent and that said Letters Patent is hereby corrected as shown below:

Title page,
Item [60], Related U.S. Application Data concerning Provisional application should be deleted.

Column 1,
Lines 4-5, "This appl. claims the benefit of Provisional No.60/017, 540 filed May 10, 1996." should be deleted.
Line 46, "weekly" should read -- weakly --.

Column 2,
Line 1, "approaches" should read -- approach --.
Line 23, "components enhancing" should read -- components having enhancing --.
Line 24, "frequencies. signal" should read -- frequencies. That is, signal --.
Line 45, "quencies increase" should read -- quencies between a reference frequency and a low end, so as to increase --.

Column 3,
Line 49, "cat" should read -- can --.

Column 8,
Line 58, "resistor 15 or 70" should read -- resistor 15 or 70 --.
Line 62, "resistor 19 or 72" should read -- resistor 19 or 72 --.
Line 64, "capacitor 18 or 66" should read -- capacitor 18 or 66 --.
Line 67, "resistor 27 or 76" should read -- resistor 27 or 76 --.

Column 9,
Line 1, "capacitor 20" should read -- capacitor 20 --.
Line 2, "or 67" should read -- or 67 --.
Line 4, "resistor 25 or 75" should read -- resistor 25 or 75 --.
Line 14, "components 15, 16" should read -- components 15, 16 --.
Line 15, "18-20, 25 and 27." should read -- 18-20, 25 and 27 --.

UNITED STATES PATENT AND TRADEMARK OFFICE
CERTIFICATE OF CORRECTION

PATENT NO.      : 6,275,593 B1
DATED           : August 14, 2001
INVENTOR(S)     : Arturo J. Garcia and Arturo H. Garcia It is certified that error appears in the above-identified patent and that said Letters Patent is hereby corrected as shown below:

<u>Column 10,</u>
Line 29, "input signal" should read -- input audio signal --.
Line 31, "human being hearing" should read -- human hearing --.

<u>Column 11,</u>
Line 59, "toward the low end, over at as" should read -- and the low end increase in amplitude as --.

<u>Column 14,</u>
Line 26, "with out" should read -- without --.
Line 35, "input signal" should read -- input audio signal --.

Signed and Sealed this

Fourth Day of February, 2003

JAMES E. ROGAN
*Director of the United States Patent and Trademark Office*